(12) United States Patent
Sakurai et al.

(10) Patent No.: US 9,173,299 B2
(45) Date of Patent: Oct. 27, 2015

(54) COLLECTIVE PRINTED CIRCUIT BOARD

(75) Inventors: Keizou Sakurai, Yasu (JP); Toshiaki Takagi, Yasu (JP)

(73) Assignee: KYOCERA CIRCUIT SOLUTIONS, INC., Kyoto (JP)

( * ) Notice: Subject to any disclaimer, the term of this patent is extended or adjusted under 35 U.S.C. 154(b) by 1056 days.

(21) Appl. No.: 13/248,218

(22) Filed: Sep. 29, 2011

(65) Prior Publication Data

US 2012/0081864 A1    Apr. 5, 2012

(30) Foreign Application Priority Data

| Sep. 30, 2010 | (JP) | 2010-221778 |
| Mar. 30, 2011 | (JP) | 2011-076518 |
| Mar. 31, 2011 | (JP) | 2011-078692 |
| Mar. 31, 2011 | (JP) | 2011-078693 |
| Aug. 1, 2011 | (JP) | 2011-168613 |

(51) Int. Cl.
*H05K 7/14* (2006.01)
*H05K 3/00* (2006.01)
(Continued)

(52) U.S. Cl.
CPC ........ *H05K 3/0052* (2013.01); *H01L 23/49822* (2013.01); *H01L 23/49827* (2013.01); *H01L 23/49833* (2013.01); *H01L 23/5389* (2013.01); *H01L 25/0655* (2013.01); *H01L 25/105* (2013.01); *H01L 25/16* (2013.01); *H05K 1/144* (2013.01); *H05K 3/0097* (2013.01); *H01L 23/49816* (2013.01); *H01L 25/0652* (2013.01); *H01L 2224/16225* (2013.01); *H01L 2224/32225* (2013.01);
(Continued)

(58) Field of Classification Search
CPC ....... H05K 1/144; H05K 3/284; H05K 3/305; H05K 3/368; H05K 3/4611; H05K 3/0052; H05K 3/0097; H01L 23/5389; H01L 23/49822; H01L 23/49827; H01L 23/49833; H01L 25/16; H01L 25/105; H01L 25/0655
See application file for complete search history.

(56) References Cited

U.S. PATENT DOCUMENTS 6,329,606 B1    12/2001    Freyman et al.
2005/0017740 A1    1/2005    Higashitani et al.
(Continued)

FOREIGN PATENT DOCUMENTS

JP    3-152967 A    6/1991
JP    7-122827 A    5/1995
(Continued)

OTHER PUBLICATIONS

Official Communication issued in corresponding Japanese Patent Application No. 2011-078693, mailed on Jul. 14, 2014.
(Continued)

*Primary Examiner* — Ramon Barrera
(74) *Attorney, Agent, or Firm* — Keating & Bennett, LLP

(57) ABSTRACT

There is provided a collective printed circuit board including a plurality of printed circuit boards each having a mounting unit on which a semiconductor element is mounted at an upper-surface central portion, and a frame having a plurality of through holes having sizes to surround the mounting portion. Upper-surface peripheral edge portions of the printed circuit boards and a through-hole peripheral portion of the frame are bonded to each other such that the mounting units are exposed from the through holes.

11 Claims, 14 Drawing Sheets

(51) Int. Cl.
*H05K 1/14* (2006.01)
*H01L 23/538* (2006.01)
*H01L 25/10* (2006.01)
*H01L 25/16* (2006.01)
*H01L 23/498* (2006.01)
*H01L 25/065* (2006.01)
*H05K 3/28* (2006.01)

(52) U.S. Cl.
CPC ............... *H01L 2224/73204* (2013.01); *H01L 2224/73253* (2013.01); *H01L 2225/107* (2013.01); *H01L 2225/1023* (2013.01); *H01L 2225/1058* (2013.01); *H01L 2924/15311* (2013.01); *H01L 2924/3511* (2013.01); *H05K 3/284* (2013.01); *H05K 2201/042* (2013.01); *H05K 2201/10674* (2013.01); *H05K 2201/2018* (2013.01)

(56) References Cited

U.S. PATENT DOCUMENTS

| 2007/0182000 A1 | 8/2007 | Higashitani et al. |
| 2011/0203836 A1 | 8/2011 | Yokota et al. |

FOREIGN PATENT DOCUMENTS

| JP | 10-189829 A | 7/1998 |
| JP | 2001-210954 A | 8/2001 |
| JP | 2001-511946 A | 8/2001 |
| JP | 2002-252472 A | 9/2002 |
| JP | 2003-243797 A | 8/2003 |
| JP | 2005-51370 A | 2/2005 |
| WO | 2010/050627 A1 | 5/2010 |

OTHER PUBLICATIONS

Official Communication issued in corresponding Japanese Patent Application No. 2011-209310, mailed on Aug. 8, 2014.

COLLECTIVE PRINTED CIRCUIT BOARD

BACKGROUND OF THE INVENTION (1) Field of the Invention

The present invention relates to a collective printed circuit board obtained by bonding a plurality of small printed circuit boards each having a mounting unit on which a semiconductor element is mounted to a frame having through holes surrounding the mounting units.

(2) Description of Related Art

Conventionally, in order to simultaneously manufacture a large number of small printed circuit boards to mount semiconductor elements thereon as disclosed in Unexamined Patent Publication No. 1998-189829, Unexamined Patent Publication No. 2001-210954, and Published Japanese Translation No. 2001-511946 of the PCT International Publication (U.S. Pat. No. 6,329,606), a collective printed circuit board is used. In the collective printed circuit board, a plurality of small printed circuit boards are integrally arranged in vertical and horizontal directions such that cutting areas are formed between the small printed circuit boards. On each of the printed circuit boards, after semiconductor elements are mounted through, for example, solder bumps, sealing is performed with a sealing resin. Thereafter, cutting is performed along the cutting areas to simultaneously manufacture electronic devices having semiconductor elements mounted on the printed circuit boards.

In the collective printed circuit board, an electric testing or an appearance check for the printed circuit boards is performed before the semiconductor elements are mounted, and a printed circuit board determined as a defective product is marked, or position information of the defective printed circuit board is recorded. In this manner, a semiconductor element can be avoided from being mounted on the printed circuit board determined as a defective product.

However, in recent years, with advances in miniaturization and multi-layering of circuits of collective printed circuit boards, processes become complicated and difficult, a yield of printed circuit boards in a collective printed circuit board tends to decrease. For this reason, the number of electronic devices that can be simultaneously manufactured from one collective printed circuit board decreases, a problem such as deterioration of operating efficiency and an increase in cost is posed.

In a conventional collective printed circuit board, when sealing is performed with a sealing resin, after the sealing resin is heated to be hardened, the temperature of the sealing resin is returned to a room temperature. At this time, the sealing resin thermally contracts largely more than the printed circuit board. As a result, the printed circuit board is warped such that an upper surface side of the printed circuit board is concaved. This is because a thermal expansion coefficient of the sealing resin is larger than a thermal expansion coefficient of the printed circuit board. When the warpage is large, electronic devices formed by cutting the collective printed circuit board are difficult to be mounted on another circuit board.

SUMMARY OF THE INVENTION

The present invention has been proposed in consideration of the above problems. More specifically, a main object of the present invention is to provide a collective printed circuit board that can increase a yield of printed circuit boards in a collective printed circuit board, prevent the number of electronic devices that can be simultaneously manufactured from one collective printed circuit board from decreasing, and solve problems such as deterioration of operating efficiency and an increase in cost.

It is another object of the present invention to provide a collective printed circuit board that can suppress warpage of an electronic device caused by a thermal processing step in sealing by a sealing resin, therefore, mount a semiconductor element on a flat printed circuit board, and stably supply the electronic device that can be preferably mounted on another circuit board.

According to the present invention, there is provided a collective printed circuit board including a plurality of printed circuit boards each having a mounting unit on which a semiconductor element is mounted at an upper-surface central portion, and a frame having a plurality of through holes having sizes to surround the mounting units, wherein upper-surface peripheral edge portions of the printed circuit boards and a through-hole peripheral portion of the frame are bonded to each other such that the mounting units are exposed from the through holes.

According to the present invention, since one collective printed circuit board is formed by independently bonding a plurality of printed circuit boards to a frame, only non-defective printed circuit boards can be selected and bonded to the frame. In this manner, a collective printed circuit board in which printed circuit boards having a very high yield are arranged can be formed. Thus, the number of electronic devices that can be simultaneously manufactured from one collective printed circuit board can be prevented from decreasing, and the problem such as deterioration of operating efficiency or an increase in cost can be solved.

According to the present invention, the rigidity can be improved by the frame, the upper-surface peripheral edge portions of the printed circuit boards are bonded to lower surfaces of the peripheral portions of the through holes formed in the frame such that semiconductor element mounting units are exposed from the through holes. For this reason, an amount of sealing resin can be minimized to suppress the upper-surface sides of the printed circuit boards from being deformed into a concave shape. In this manner, there can be provided a collective printed circuit board in which semiconductor elements are mounted on flat printed circuit boards and that can stably supply electronic devices that can be preferably mounted on another circuit board.

DETAILED DESCRIPTION OF PREFERRED EMBODIMENTS

An example of an embodiment of a collective printed circuit board according to the present invention will be described below with reference to FIGS. 1 to 9. As shown in these drawings, a collective printed circuit board 30 of this example is mainly configured by a printed circuit board 10 and a frame 20.

Figure 1A:
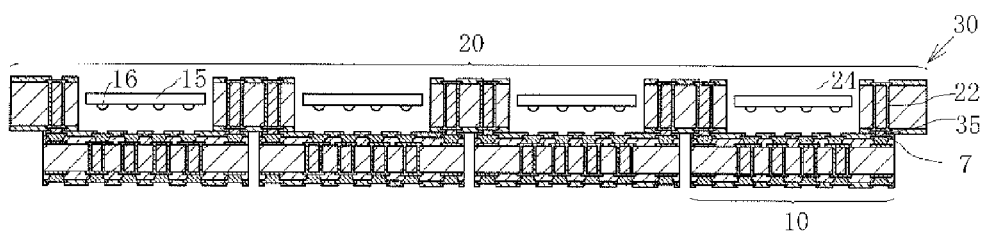
FIGS. 1A and 1B are a sectional view and an upper view showing an embodiment in a collective printed circuit board according to the present invention.
Figure 1B:
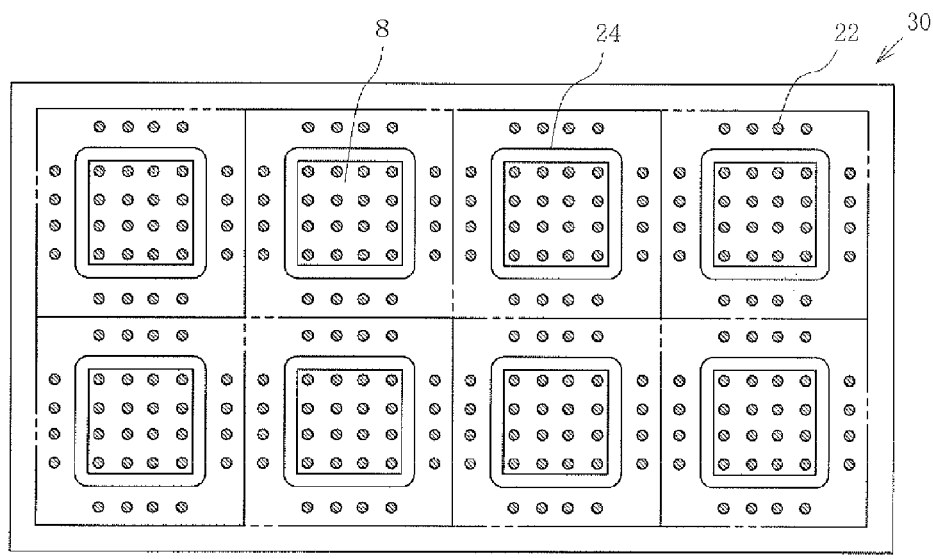

As shown in FIG. 1, a plurality of small printed circuit board 10 to mount a semiconductor element 15 thereon are bonded to a lower surface of the frame 20 to support the printed circuit boards 10.

Figure 2A:
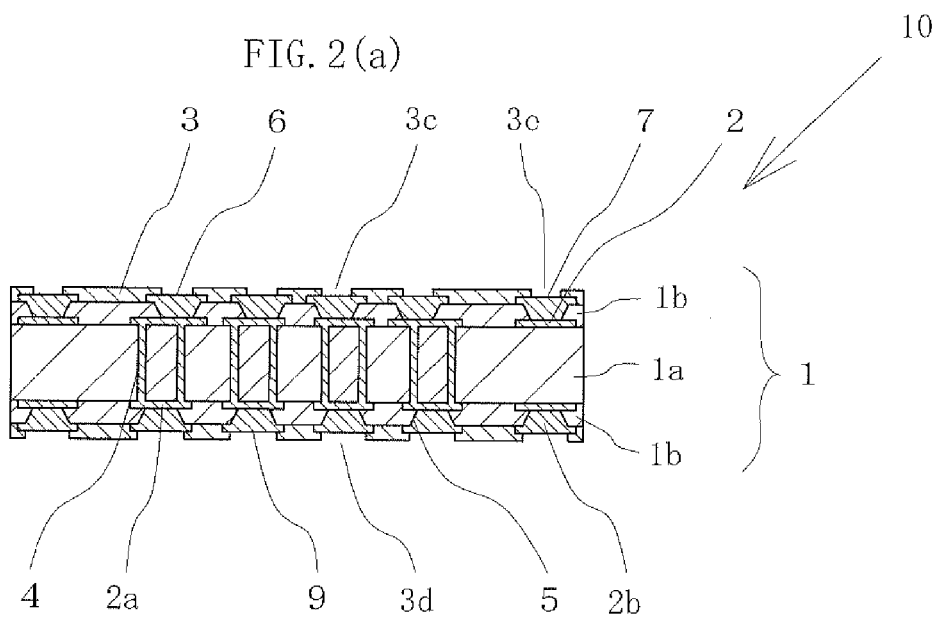
FIGS. 2A and 2B are a sectional view and an upper view showing an example of a printed circuit board in the collective printed circuit board according to the present invention.
Figure 2B:
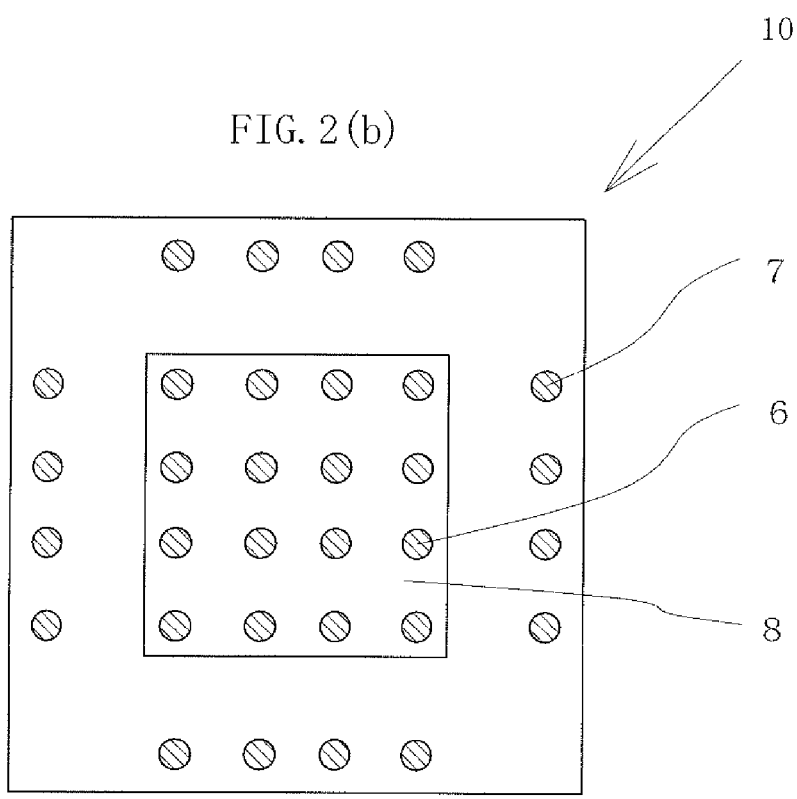

Each of the printed circuit boards 10 includes, as shown in FIGS. 2A and 2B, for example, an insulating substrate 1 obtained by stacking insulating layers 1b on upper and lower sides of an insulating plate 1a, respectively, conductive layers 2 formed on the insulating plate 1a and the insulating layer 1b, and a solder resist layer 3 used as a protective layer. A mounting portion 8 on which the semiconductor element 15 is mounted is formed on an upper-surface central portion of the printed circuit board 10.

The insulating plate 1a constituting the insulating substrate 1 is made of an electric insulating material obtained by impregnating a thermosetting resin such as an epoxy resin or a bismaleimide triazine resin in glass fiber sheet. In the insulating plate 1a, a plurality of through holes 4 vertically penetrate the insulating plate 1a are formed by drilling. A through hole conductor 2a is formed on a side wall of each of the through holes 4 to electrically conduct the upper and lower conductive layers 2 of the insulating plate 1a.

The insulating layers 1b stacked on the upper and lower sides of the insulating plate 1a is made of an electric insulating material containing thermosetting resin such as an epoxy resin or a polyimide resin. A plurality of via holes 5 that penetrates the insulating layers 1b from the upper surface to the lower surface thereof are formed by laser processing. Via conductors 2b are filled in the via holes 5. In this manner, the upper and the lower conductive layers 2 of the insulating layer 1b are electrically connected to each other.

The conductive layers 2 are wires formed by copper-plated layers or a metal such as copper foil by using a known subtractive method or a semi-additive method, for example. The conductive layers 2 function as paths that supply an electric power to or input/output a signal to/from the semiconductor element 15.

The solder resist layer 3 is made of a thermosetting resin such as an acrylic modified epoxy resin having photosensitivity, and has openings 3c, 3d, and 3e that partially expose the conductive layers 2. The solder resist layer 3 keeps the electric insulativity of the conductive layers 2 preferable, and has a function of protecting the conductive layers 2.

A part of the conductive layers 2 exposed from the opening 3c of the solder resist layer 3 at the mounting portion 8 forms a semiconductor element connection pad 6. An electrode 16 of the semiconductor element 15 is connected to the semiconductor element connection pad 6 through, for example, a solder bump. On the lower surface, a part of the conductive layers 2 exposed from the opening 3d of the solder resist layer 3 forms an external connection pad 9. The external connection pad 9 is connected to a wiring conductor of an external electric circuit board through, for example, a solder ball. Furthermore, at the upper-surface peripheral edge portion of the printed circuit board 10, a part of the conductive layers 2 is exposed from the opening 3e of the solder resist layer 3. The part exposed from the opening 3e forms a frame connection pad 7 to be electrically connected to the frame 20. The frame connection pad 7 is connected to a connection conductor 22 of the frame 20 (will be described later).

Figure 3A:
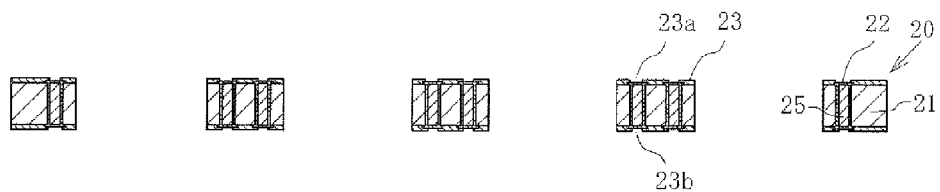
FIGS. 3A and 3B are a sectional view and an upper view showing an example of a frame in the collective printed circuit board according to the present invention.
Figure 3B:
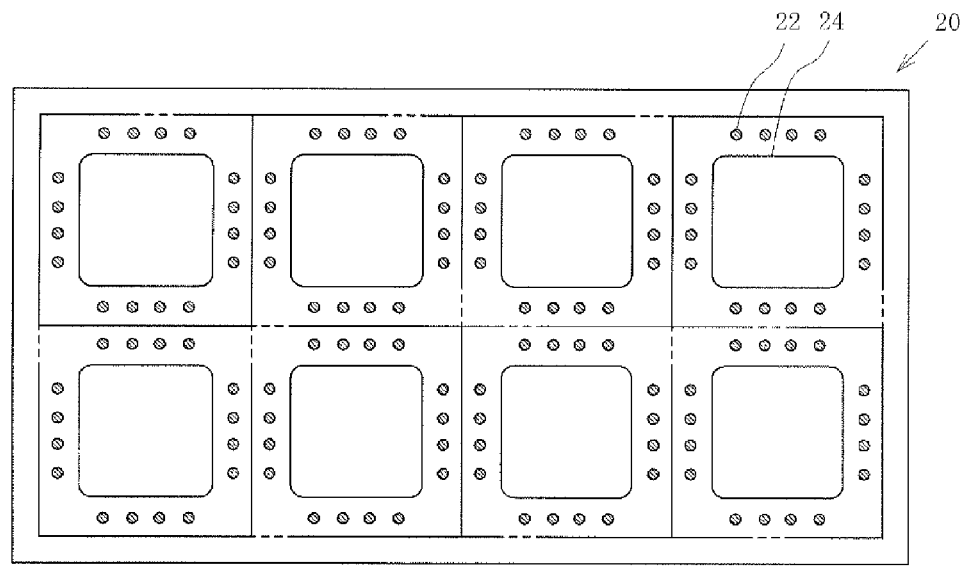
Figure 4:
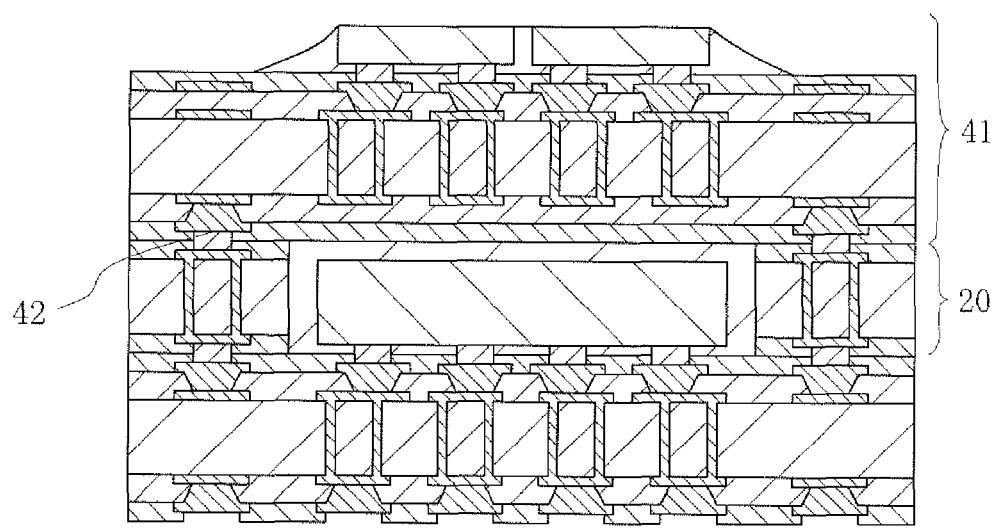
FIG. 4 is a sectional view for explaining an example of an embodiment in the collective printed circuit board according to the present invention.
Figure 5:
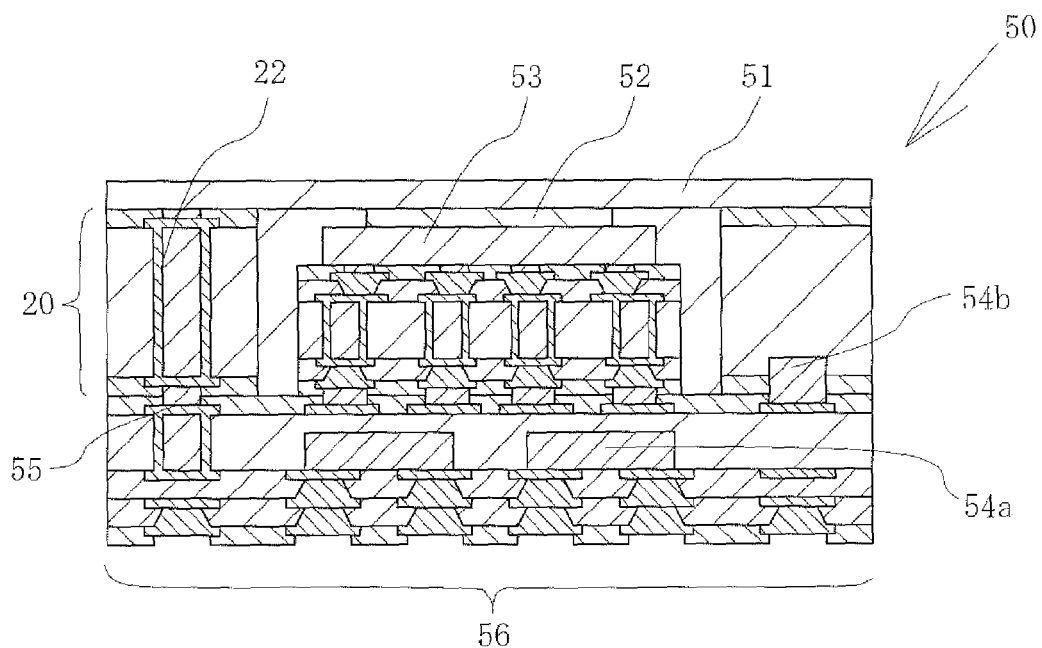
FIG. 5 is a sectional view for explaining an example of the embodiment in the collective printed circuit board according to the present invention.
Figure 6:
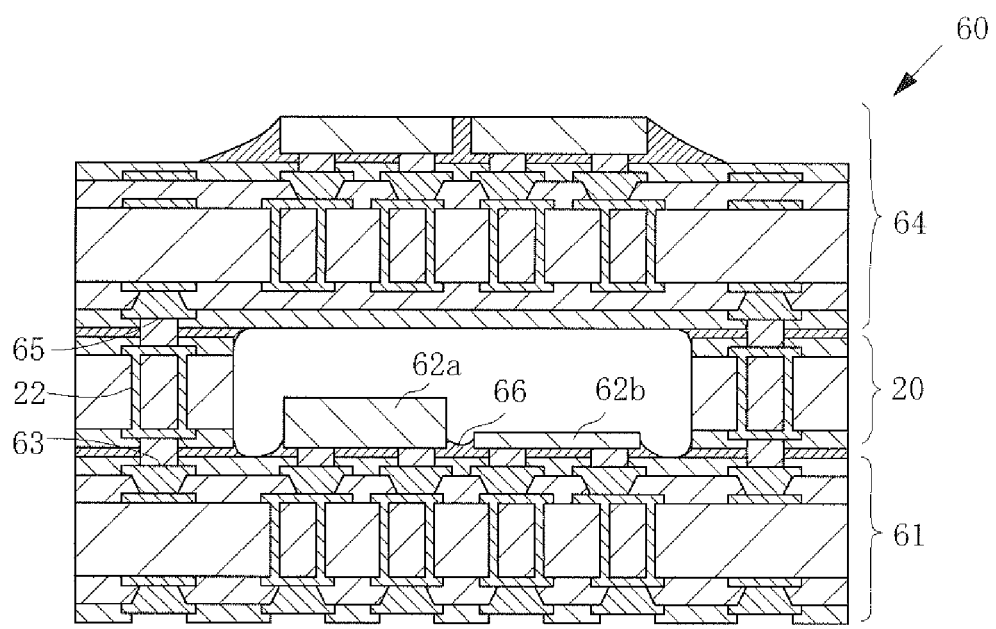
FIG. 6 is a sectional view for explaining an example of the embodiment in the collective printed circuit board according to the present invention.
Figure 7:
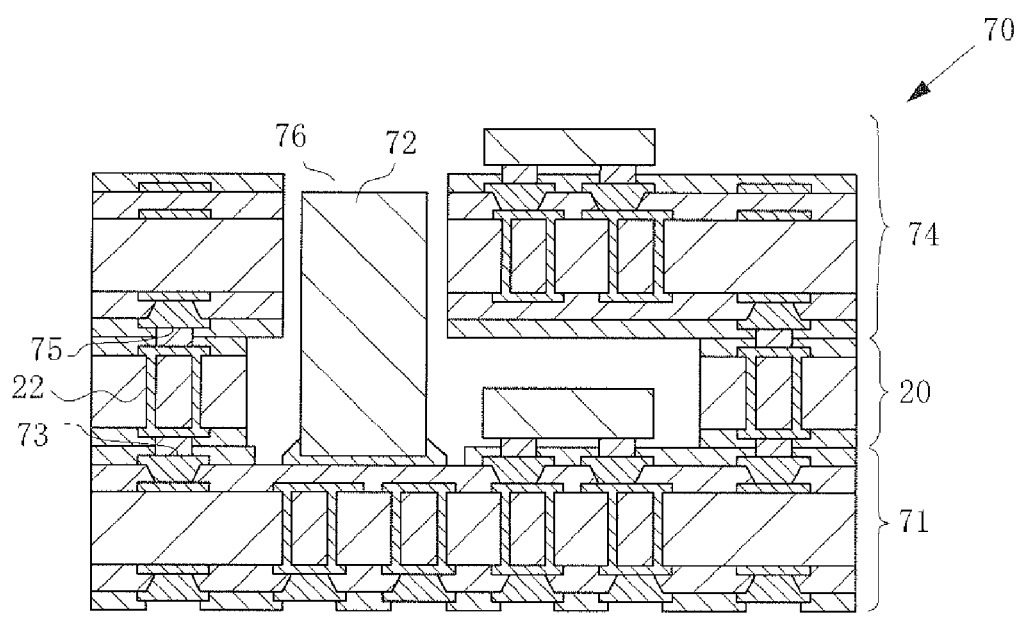
FIG. 7 is a sectional view for explaining an example of the embodiment in the collective printed circuit board according to the present invention.
Figure 8:
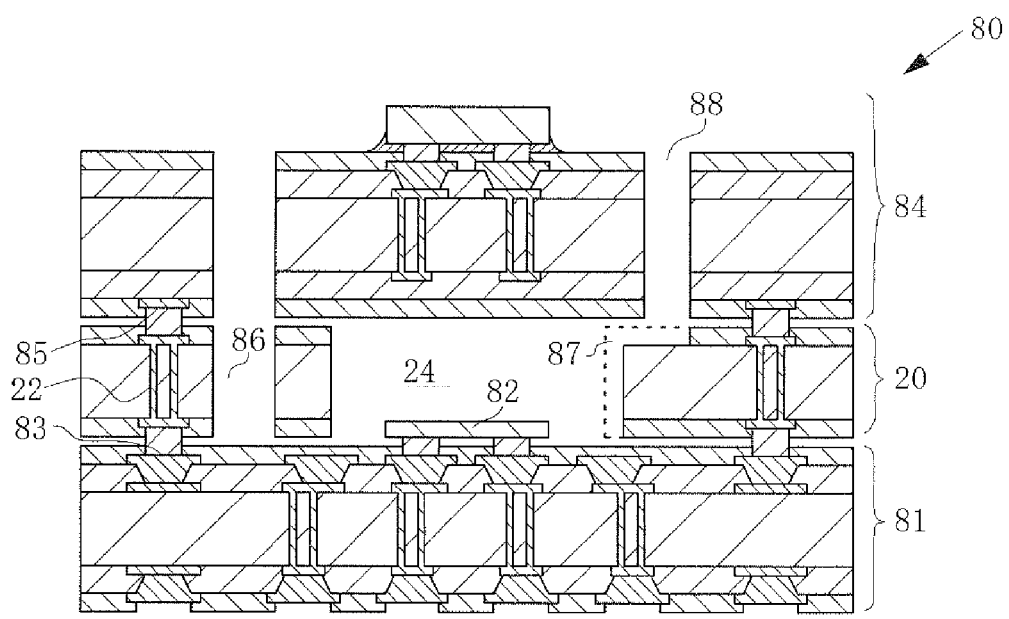
FIG. 8 is a sectional view for explaining an example of the embodiment in the collective printed circuit board according to the present invention.
Figure 9:
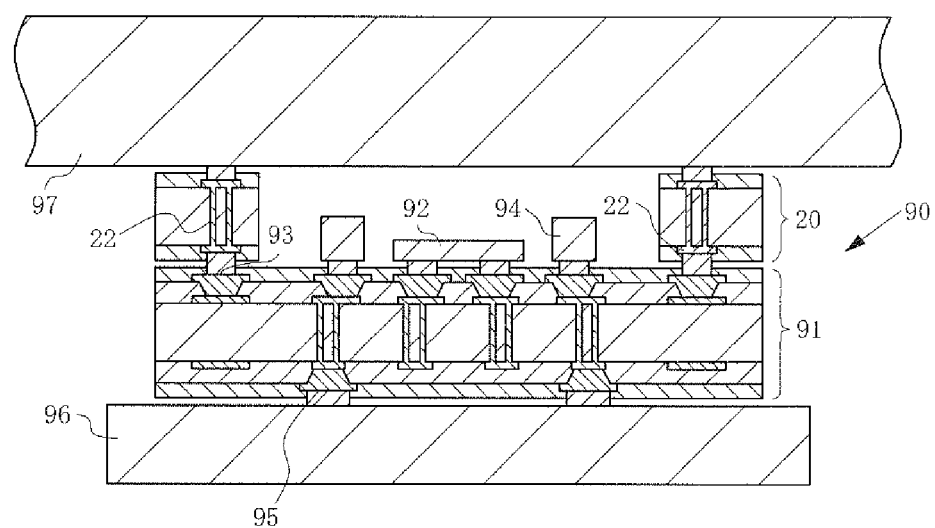
FIG. 9 is a sectional view for explaining an example of the embodiment in the collective printed circuit board according to the present invention.

The frame 20, as shown in FIG. 3A, includes an insulating plate 21, the connection conductor 22 that penetrates the insulating plate 21, and solder resist layers 23 formed on the upper and lower surfaces of the insulating plate 21. The frame 20 functions as a supporter that supports the plurality of printed circuit boards 10 in a predetermined alignment, and has a through hole 24 having a size to surround the mounting portion 8 of the printed circuit board 10 at a position corresponding to the alignment of the supported printed circuit boards 10. Around the through hole 24, the connection conductor 22 is formed at a position corresponding to the frame connection pad 7 described above.

The insulating plate 21 is made of an electric insulating material obtained by impregnating a thermosetting resin such as an epoxy resin or a bismaleimide triazine resin in glass fiber sheet. The through hole 24 is formed by, for example, routing. A plurality of through holes 25 to form the connection conductor 22 are formed around the through hole 24 by drilling. The insulating plate 21 has a function as a core material that strengthens the frame 20. The insulating plate 21 preferably has a thickness of 0.3 mm or more to keep rigidity to suppress warpage occurring in a sealing operation after the semiconductor element 15 is mounted on the collective printed circuit board 30 of this example.

The connection conductor 22 is formed by, for example, copper plating, and is formed by coating a metal such as copper on side walls of the through holes 25 by a plating method or the like. The connection conductor 22 is connected to the frame connection pad 7 of the printed circuit board 10 to make it possible to mount another electronic part, a radiator plate, or the like on the upper surface of the frame 20 to electrically connect the electronic part or the radiator plate to the conductive layers 2 of the printed circuit board 10.

The solder resist layers 23 is made of an electric insulating material containing thermosetting resin such as an epoxy resin or a polyimide resin, and has openings 23a and 23b that expose the upper end and the lower end of the conductive conductor 22.

The plurality of printed circuit boards 10 are bonded to the lower surface of the frame 20 such that the mounting portion 8 is exposed in the through hole 24 and the frame connection pad 7 and the connection conductor 22 are electrically connected to each other, thereby forming the collective printed circuit board 30 shown in FIG. 1. The printed circuit boards 10 and the frame 20 are bonded to each other such that the plurality of connection conductors 22 formed on a peripheral portion of the through hole 24 of the frame 20 and the plurality of corresponding frame connection pads 7 formed on upper-surface peripheral edges of the printed circuit boards 10 are bonded through a bonding material 35. As the bonding material 35, for example, a solder is used. A solder bump (not shown) is formed on the frame connection pad 7 by a printing method, and the corresponding connection conductor 22 is placed on the solder bump and subjected to a reflow process in a condition of 220 to 260° C. in a state in which the frame 20 and the printed circuit board 10 overlap so as to bond the printed circuit boards 10 to the frame 20.

As the bonding material 35, in addition to the solder described above, an anisotropic conductive material such as an anisotropic conductive film or an anisotropic conductive paste may be used. This is obtained by mixing conductive particles of a gold-plated resin or the like in a thermosetting resin such as an epoxy resin or a synthetic rubber resin. An anisotropic conductive material is placed on the frame connection pad 7, the corresponding connection conductor 22 is placed on the anisotropic conductive material, and the connection conductor 22 and the printed circuit board 10 are bonded to each other by thermocompression in conditions of 100 to 200° C. and 3 to 5 MPa such that the frame 20 and the printed circuit board 10 overlap.

The printed circuit board 10 is subjected to an electric testing and an appearance check before the printed circuit board 10 is bonded to the frame 20, and only non-defective printed circuit boards 10 are bonded to the frame 20. In this manner, the collective printed circuit board 30 having the printed circuit boards 10 formed at a very high yield can be obtained. Thereafter, in the collective printed circuit board 30, the semiconductor element 15 is mounted on the mounting portion 8 of each of the bonded printed circuit boards 10. In order to mount the semiconductor element 15, for example, a solder ball is mounted on the semiconductor element connection pad 6, and the electrode 16 of the corresponding semiconductor element 15 is overlapped on the solder ball and subjected to a reflow process in a condition of about 220 to 260° C., i.e., the electrode 16 and the solder ball are connected to each other by a flip chip technique.

After the semiconductor element 15 is mounted, a sealing resin made of a thermosetting resin is injected into the through hole 24. Thereafter, the semiconductor element 15 is sealed by thermally curing the sealing resin. The injection of the resin is performed by a printing method that a resin is applied by using, for example, a printing mask. At this time, according to the collective printed circuit board 30 of the present invention, the side wall of the through hole 24 has a role of preventing the sealing resin from flowing out. For this reason, a metal mold for sealing resin injection that is required in the past is not required. When the size of the through hole 24 is minimized to seal the through hole 24, an amount of sealing resin to be injected can be reduced. The sealing resin is thermally cured at a temperature of 150 to 250° C. At this time, since the collective printed circuit board 30 is increased in rigidity by the frame 20, the printed circuit board 10 can be suppressed from being deformed by thermal contraction of the sealing resin.

Upon completion of the sealing operation, a different electronic part or a radiator plate are mounted on the frame 20, for example. A mode in which the different electronic part is further mounted on the frame 20 is called so-called PoP (Package on Package). An explanation of the embodiment will be made with reference to FIG. 4. In this case, the connection conductor 22 exposed from the openings 23a formed in the frame 20 and an electrode 42 of a different electronic part 41 are bonded to each other through a conductive bonding material such as a solder to make it possible mount the different electronic part 41 and printed circuit board 10 that are electrically connected to each other. When a metal radiator plate is mounted on the frame 20, the radiator plate and the connection conductor 22 are bonded to each other through a conductive bonding material such as a solder. The radiator plate is preferably connected to the ground potential.

After the semiconductor element 15 and the different electronic part are mounted on the collective printed circuit board 30, independent electronic devices cut by, for example, a dicing apparatus along cutting areas between the printed circuit boards 10 are obtained.

As described above, in the collective printed circuit board 30, only the non-defective printed circuit boards 10 are selected and bonded to the frame 20 to make it possible to prevent the number of electronic parts that can be simultaneously manufactured from one collective printed circuit board 30 from decreasing and to solve a problem such as deterioration of operating efficiency and an increase in cost. The rigidity is improved by the frame 20, and a sealing resin used when the semiconductor element 15 mounted on the printed circuit board 10 is sealed is minimized to make it possible to suppress deformation caused by a difference in thermal expansion between the sealing resin and the printed circuit board 10. In this manner, the collective printed circuit board 30 in which the semiconductor element 15 is mounted on the flat printed circuit board 10 and that can stably supply an electronic device that can be preferably mounted on another circuit board can be provided.

The present invention is not limited to an example of the embodiment described above. For example, in an example of the embodiment described above, the frame 20 includes the connection conductor 22, and the different electronic part and a radiator plate are mounted on the frame 20 to be electrically connected to the connection conductor 22. However, the frame 20 need not always include the connection conductor 22, and the different electronic part and the radiator plate need not be always mounted on the frame 20.

Furthermore, the collective printed circuit board of the present invention can also be applied to an electronic device in which, for example, a capacitor and a resistor are built. The embodiment will be described with reference to FIG. 5. In this example, a printed circuit board 56 in which, for example, passive parts 54a and 54b are incorporated is bonded to the frame 20. The passive part 54a is buried in the printed circuit board 56. The passive part 54b is mounted on an upper surface of the printed circuit board 56 at a position corresponding to the frame 20.

A recessed portion in which the passive part 54b can be housed at a position corresponding to the passive part 54b is formed in the frame 20. A frame connection pad 55 of an upper-surface end portion of the printed circuit board 56 and the connection conductor 22 exposed from an opening 23b are bonded to the frame 20 through a conductive bonding material. Thereafter, a semiconductor element 53 is mounted on an upper surface of the printed circuit board 56 by the flip chip technique described above. Furthermore, a sealing resin is injected into the through hole 24 of the frame 20, and a metal radiator plate 51 is bonded to the frame 20 to close up the through hole 24. At this time, the radiator plate 51 is preferably electrically connected to a ground conductor of the printed circuit board 56 through the connection conductor 22 of the frame 20. The semiconductor element 53 and the radiator plate 51 are preferably thermally connected to each other through a connection layer 52 such as an epoxy resin containing, for example, thermal grease or thermally conductive particles. By employing the mode, electronic devices each having a passive part and a small warpage can be efficiently and stably provided at a high yield.

In the example described above, a sealing resin is entirely filled in the through hole 24 of the frame 20 to which the printed circuit board 10 is bonded. However, the sealing resin may be filled in a bonded portion that is required to be reinforced with a resin. The embodiment will be described with reference to FIG. 6. A frame connection pad 63 on an upper-surface end portion of a printed circuit board 61 and the connection conductor 22 exposed from the opening 23b on a lower-surface side of the frame 20 are bonded to each other through a conductive bonding material. Thereafter, semiconductor elements 62a and 62b are mounted on an upper surface of the printed circuit board 61 through a conductive bonding material. A sealing resin 66 made of a thermosetting resin is injected by using, for example, an air nozzle into a bonding portion between the printed circuit board 61 and the frame 20 or a bonding portion between the printed circuit board 61 and the semiconductor elements 62a and 62b. At this time, when an enclosure to prevent the sealing resin 66 from flowing is formed around the semiconductor element by a solder resist, the sealing resin can be easily injected. When the sealing resin 66 is thermally cured at a temperature of 150 to 250° C., the sealing resin 66 filling is completely finished. A second printed circuit board 64 is bonded to the frame 20 through a conductive bonding material such that an electrode 65 on a lower-surface end portion of the second printed circuit board 64 is connected to a connection conductor 22 exposed from the opening 23a on an upper-surface side of the frame 20. In this manner, when an amount of sealing resin filled in the through hole 24 is reduced, warpage of an electronic device 60 caused by a difference in thermal expansion coefficient between the printed circuit board described above and the sealing resin can be more suppressed.

The collective printed circuit board according to the present invention can also be applied to an electronic device in which high-profile electronic parts are mounted on, for example, a printed circuit board. The embodiment will be described with reference to FIG. 7. A frame connection pad 73 on an upper-surface end portion of a printed circuit board 71 and the connection conductor 22 exposed from the opening 23b on a lower-surface side of the frame 20 are bonded through a conductive bonding material. Thereafter, an electronic part 72 is mounted on an upper surface of the printed circuit board 71 through a conductive bonding material. A second printed circuit board 74 is bonded to the frame 20 through a conductive bonding material such that an electrode 75 on a lower-surface end portion of the second printed circuit board 74 is connected to the connection conductor 22 exposed from the openings 23a on an upper-surface side of the frame 20. At this time, in the second printed circuit board 74 at a position corresponding to the electronic part 72, an opening 76 that can house the electronic part 72 projecting from frame 20 is formed. The opening 76 is formed by a router device or the like. By employing the mode, the electronic part 72 can be avoided from colliding with the second printed circuit board 74, and electronic devices 70 can be efficiently and stably provided at a high yield without increasing the thicknesses of the electronic devices 70. Furthermore, the present invention can also be applied to an electronic device in which a variable resistor is mounted as the electronic part 72 in the example and that can operate a variable part by using the opening 76.

The collective printed circuit board according to the present invention can also be applied to an electronic device in which a flux residual adhering to the printed circuit board on the inside of, for example, the electronic device needs to be efficiently cleaned up. The embodiment will be described with reference to FIG. 8. A frame connection pad 83 on an upper-surface end portion of a printed circuit board 81 and the connection conductor 22 exposed from the opening 23b on a lower-surface side of the frame 20 are bonded to each other through a conductive bonding material. Thereafter, a semiconductor element 82 is mounted on an upper surface of the printed circuit board 81 through a conductive bonding material. A second printed circuit board 84 is bonded to the frame 20 through a conductive bonding material such that an electrode 85 on a lower-surface end portion of the second printed circuit board 84 is connected to the connection conductor 22 exposed from the openings 23a on an upper-surface side of the frame 20. When the second printed circuit board 84 is bonded to the frame 20, the through hole 24 is partially opened not to completely close the through hole 24, and the through hole 24 is used as an injection/discharge port of a cleaning liquid for removing a flux residual. At this time, in the frame 20, in a position corresponding to a bonding portion between the printed circuit board 81 and the second printed circuit board 84, a plurality of through holes 86 and a plurality of trenches 87 are formed. In the second printed circuit board 84, second through holes 88 are formed at positions corresponding to the through holes 86 and the trenches 87. The through holes 86 are formed by a drilling device and have diameters of about $\phi 0.08$ to 0.5 mm. The trenches 87 are formed by a router device, and have widths of about 0.03 to 1 mm and depths of about 0.5 to 10 μm. The second through holes 88 are formed by a drilling device and have diameters of about $\phi 0.1$ to 1 mm. By the through holes 86, the trenches 87, and the second through holes 88, a sufficient quantity of cleaning liquid can also be spread on a gap between the frame 20 and the printed circuit board 81 or between the frame 20 and the second printed circuit board 84, and a flux residual adhering to an internal surface of an electronic device 80 can be efficiently cleaned up.

The collective printed circuit board according to the present invention can also be applied to an electronic device in which a plurality of semiconductor elements and a plurality of electronic parts are required to be mounted on both the major surfaces of, for example, a printed circuit board. The embodiment will be described with reference to FIG. 9. A frame connection pad 93 on an upper-surface end portion of a printed circuit board 91 and the connection conductor 22 exposed from the opening 23b on a lower-surface side of the frame 20 are bonded through a conductive bonding material. Thereafter, a semiconductor element 92 and a first electronic part 94 are mounted on a portion surrounded by the frame 20 on the upper-surface side of the printed circuit board 91 through a conductive bonding material. An electrode 95 on a lower surface of the printed circuit board 91 and a second electronic part 96 are mounted through a conductive bonding material.

The connection conductor 22 exposed from the openings 23a on an upper-surface side of the frame 20 is connected as an external connection pad to an external electronic circuit board 97 through a conductive bonding material. In this manner, the frame 20 is interposed between the printed circuit board 91 and the external electronic circuit board 97 to form a space in a position surrounded by the frame 20 on the upper-surface side of the printed circuit board 91, and the semiconductor element 92 and the first electronic part 94 can be mounted. Furthermore, the second electronic part 96 is also mounted on a lower-surface side of the printed circuit board 91. In this manner, a plurality of semiconductor elements or electronic parts can be mounted on both the major surfaces of the printed circuit board.

Figure 10:
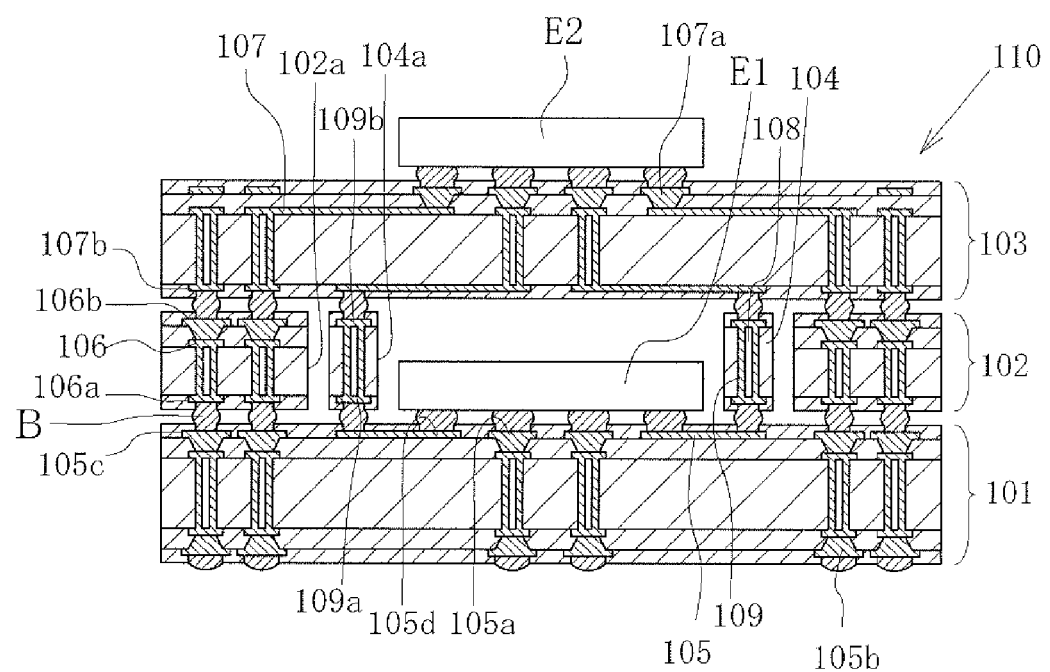
FIG. 10 is a schematic sectional view showing an example of another embodiment in the collective printed circuit board according to the present invention.

Another embodiment of a collective printed circuit board according to the present invention will be described below with reference to FIG. 10. FIG. 10 is a schematic sectional view showing an example of an embodiment of a printed circuit board 110 obtained from the collective printed circuit board according to the present invention. The printed circuit board 110 of the example includes a first printed circuit board 101 in which an electronic part is mounted on an upper-surface central portion, a frame 102 bonded to an upper surface of the first printed circuit board 101 to have an opening surrounding the electronic part, and a second printed circuit board 103 bonded to an upper surface of the frame 102 to close the opening. A third printed circuit board 104 including a layer configuration or a material different from that of the frame 102 is bonded between the first printed circuit board 101 and the second printed circuit board 103 on the internal side of the opening.

The first printed circuit board 101 is a high-density multi-layered printed circuit board formed by, for example, a buildup method. An electronic part E1 is mounted on an upper surface of the first printed circuit board 101. A wiring conductor 105 including copper foil or a copper-plated layer is arranged from an upper surface to a lower surface of the first printed circuit board 101. A part of the wiring conductor 105 forms an electronic part connection pad 105a electrically connected to the electronic part E1, an external connection pad 105b connected to an external electronic circuit board, a connection pad 105c connected to the frame 102, and a connection pad 105d connected to the third printed circuit board 104. Since the wiring conductor 105 is partially formed by the buildup method, for example, high density wires can be formed by very thin wires each having a wire width and a wire interval of 20 μm or less.

The frame 102, like the first printed circuit board 101, is a high-density multi-layered printed circuit board formed by, for example, the buildup method, and has an opening 102a surrounding the electronic part E1 mounted on the first printed circuit board 101. A lower surface of the frame is bonded to the first printed circuit board 101, and an upper surface thereof is bonded to the second printed circuit board 103. Like the first printed circuit board 101, a wiring conductor 106 including copper foil or a copper-plated layer is arranged from the upper surface to the lower surface of the frame 102. A part of the wiring conductor 106 forms a connection pad 106a connected to the first printed circuit board 101 and a connection pad 106b connected to the second printed circuit board 103.

Like the first printed circuit board 101 or the frame 102, the second printed circuit board 103 is also a high-density multi-layered printed circuit board formed by, for example, the buildup method. The second printed circuit board 103 is bonded to the upper surface of the frame 102 to close the opening 102a. An electronic part E2 is mounted on an upper surface of the second printed circuit board 103. Also on the second printed circuit board 103, a wiring conductor 107 including copper foil or a copper-plated layer is arranged from an upper surface to a lower surface of the second printed circuit board 103. A part of the wiring conductor 107 forms an electronic part connection pad 107a electrically connected to the electronic part E2 and a connection pad 107b connected to the frame 102.

The third printed circuit board 104 is formed by forming a through hole 108 in, for example, a single-layered glass epoxy plate and has an opening 104a surrounding the electronic part E1. A lower surface of the third printed circuit board 104 is bonded to the first printed circuit board 101, and an upper surface thereof is bonded to the second printed circuit board 103. A wiring conductor 109 including copper foil or a copper-plated layer is arranged from an upper surface to a lower surface of the third printed circuit board 104 through a through hole 108. A part of the wiring conductor 109 forms a connection pad 109a connected to the first printed circuit board 101 and a connection pad 109b connected to the second printed circuit board 103. A diameter of the through hole 108 is a large diameter of about 100 to 300 μm. The connection pad 109a and the connection pad 109b can be electrically connected to each other with a low resistance through the large-diameter through hole 108.

The first printed circuit board 101 and the frame 102 and the third printed circuit board 104 are connected to each other through solder balls B, fixed to each other, and electrically connected to each other, and the frame 102 and third printed circuit board 104 and the second printed circuit board 103 are connected to each other through the solder balls B, fixed to each other, and electrically connected to each other. Since the frame 102 is a high-density multi-layered printed circuit board formed by a buildup method, the frame 102 can high-density connect the first printed circuit board 101 and the second printed circuit board 103 serving as the high-density printed circuit boards formed by the buildup method like the frame 102 with a high density. Furthermore, the third printed circuit board 104 can electrically connect the first printed circuit board 101 and the second printed circuit board 103 through the through hole 108 with a low resistance.

In this case, preferably for example, signal wires on the large number of first printed circuit boards 101 and second printed circuit boards 103 that are required to be connected are electrically connected to each other through the high-density wiring conductor 106 of the frame 102, and the ground or power supply wires that require a large current are electrically connected to each other through the low-resistance wiring conductor 109 of the third printed circuit board 104. In this manner, a large number of signals can be exchanged between the first printed circuit board 101 and the second printed circuit board 103 through the wiring conductor 106, and the printed circuit board 110 that can supply a sufficient ground voltage and a power supply voltage through the wiring conductor 109 can be provided.

For example, when the third printed circuit board 104 is formed of a material having good heat conductivity, for example, a highly heat conductive metal such as copper or a highly heat conductive ceramic material such as aluminum nitride, the first printed circuit board 101 and the second printed circuit board 103 can be connected to each other with a low heat resistance, and heat from the electronic part E1 can be efficiently radiated to the outside. Furthermore, when the third printed circuit board 104 is formed by a high-rigidity material such as aluminum nitride, for example, when buildup circuit boards that do not have core circuit boards are used as the first printed circuit board 101, the frame 102, and the second printed circuit board 103, the composite printed circuit board 110 that has less warpage or less deformation can be provided.

In this manner, according to the composite printed circuit board 110 of the example, inside the opening of the frame 102 that bonds the first printed circuit board 101 and the second printed circuit board 103 to each other, the third printed circuit board having a layer configuration or a material different from that of frame 102 is arranged to bond the first printed circuit board and the second printed circuit board to each other and thus the first printed circuit board and the second printed circuit board can be bonded to each other by extensive connecting paths through the third printed circuit board and the frame. For this reason, a degree of freedom of design increases, and a multi-functional advanced composite printed circuit board 10 can be provided.

Figure 11:
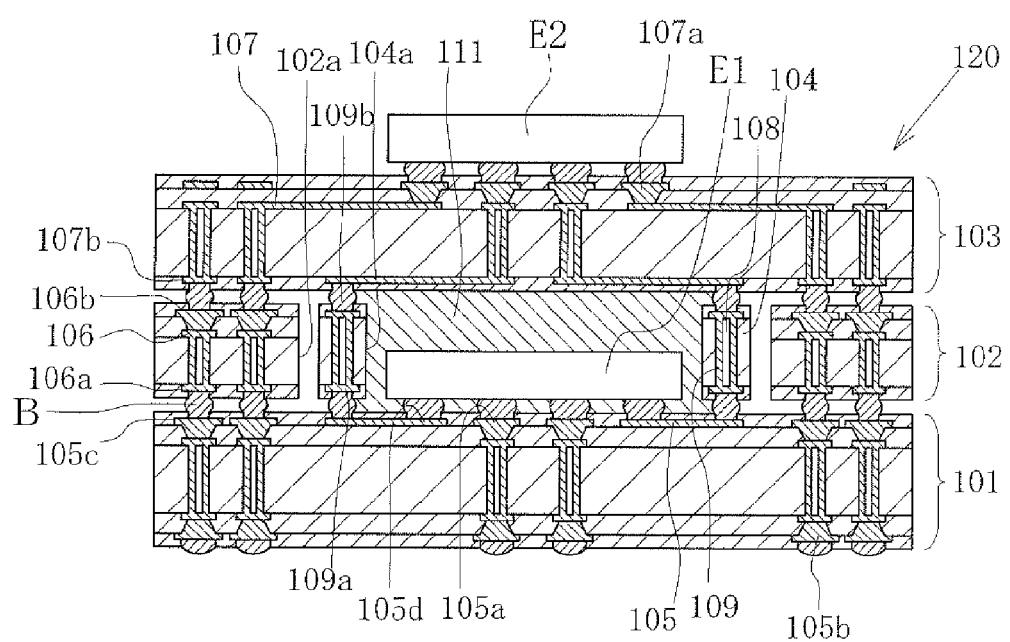
FIG. 11 is a schematic sectional view showing an example of still another embodiment in the collective printed circuit board according to the present invention.

The present invention is not limited to an example of the embodiment described above. For example, as shown in FIG. 11, only the inside of the third printed circuit board 104 may be partially sealed with a sealing resin 111. In this case, the electronic part E1 can be sealed with a small amount of sealing resin 111, and warpage to the printed circuit board 110 by the sealing resin 111 can be reduced.

Figure 12:
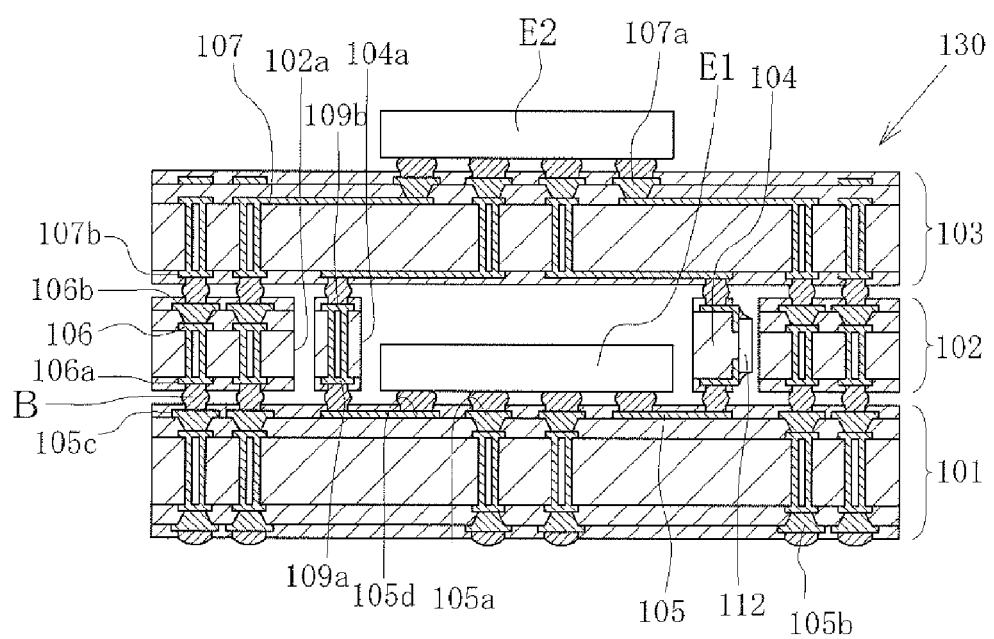
FIG. 12 is a schematic sectional view showing an example of another embodiment of the present invention.

Furthermore, as shown in FIG. 12, on a side surface of the third printed circuit board 104, for example, a chip capacitor 112 may be arranged between the first printed circuit board 101 and the second printed circuit board 103. In this case, the first printed circuit board 101 and the second printed circuit board 103 can be connected by the chip capacitor 112 with a low resistance and a short path.

Furthermore, in an example of the embodiment described above, the external frame 102 is formed by a high-density multi-layered printed circuit board formed by a buildup method, and the internal third printed circuit board 104 is formed by a single-layered glass epoxy plate. However, the external frame 102 may be formed by a single-layered glass epoxy plate, and the internal third printed circuit board 104 may be formed by a high-density multi-layered printed circuit board obtained by the buildup method.

Figure 13A:
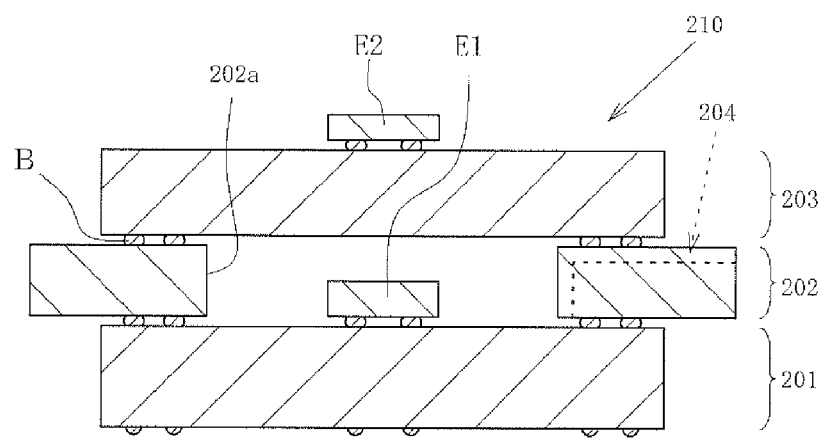
FIG. 13 is a schematic sectional view showing an example of still another embodiment of the present invention.
Figure 13B:
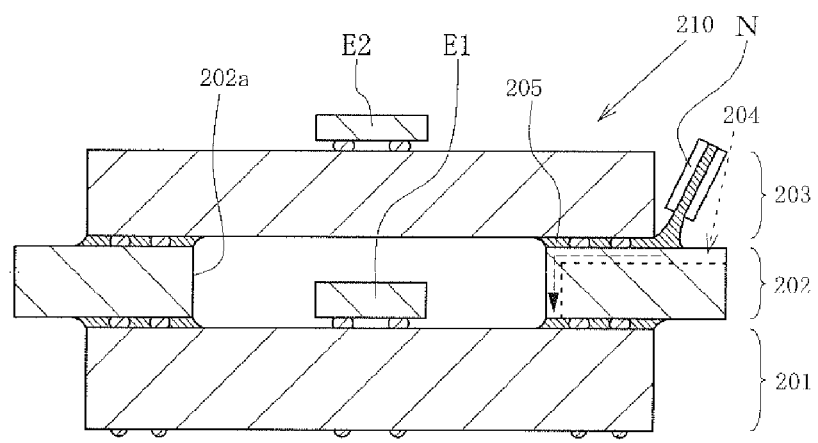

An example of an embodiment of a collective printed circuit board according to the present invention will be described below with reference to FIG. 13. FIGS. 13A and 13B are schematic sectional views for explaining an example of an embodiment of a printed circuit board obtained from the collective printed circuit board according to the present invention. The printed circuit board 210 includes a first printed circuit board 201 in which the electronic part E1 is mounted on an upper-surface central portion, a frame 202 bonded to an upper surface of the first printed circuit board 201 to have an opening surrounding the electronic part E1 through a solder bump, and the second printed circuit board 203 bonded to an upper surface of the frame through a solder bump to cover the opening of the frame 202.

The first printed circuit board 201 is a high-density multi-layered printed circuit board formed by, for example, a buildup method. An electronic part E1 is mounted on an upper surface of the first printed circuit board 201. A wiring conductor (not shown) is arranged from an upper surface to a lower surface of the first printed circuit board 201.

The frame 202, like the first printed circuit board 201, is a high-density multi-layered printed circuit board formed by, for example, the buildup method, and has an opening 202a surrounding the electronic part E1 mounted on the first printed circuit board 201. A lower surface of the frame is bonded to the first printed circuit board 201, and an upper surface thereof is bonded to the second printed circuit board 203. Like the first printed circuit board 201, a wiring conductor (not shown) is arranged from the upper surface to the lower surface of the frame 202.

Like the first printed circuit board 201 or the frame 202, the second printed circuit board 203 is also a high-density multi-layered printed circuit board formed by, for example, the buildup method. The second printed circuit board 203 is bonded to the upper surface of the frame 202 to close the opening 202a. An electronic part E2 is formed on an upper surface of the second printed circuit board 203. Also on the second printed circuit board 203, a wiring conductor (not shown) is arranged from the upper surface to the lower surface of the second printed circuit board 203.

The first printed circuit board 201 and the frame 202 are bonded to each other through the solder balls B, fixed to each other, and electrically connected to each other, and the frame 202 and the second printed circuit board 203 are bonded to each other through the solder balls B, fixed to each other, and electrically connected to each other.

On the printed circuit board 210 of the example, a flow path 204 for a sealing resin is formed from the upper surface of the frame 202 between the frame 202 and the second printed circuit board 203 and between the first printed circuit board 201 and the frame 202. The flow path 204 is configured by a trench having, for example, a width of 200 μm and a depth of 30 μm, and is formed from an upper-surface outer peripheral portion of the frame 202 between the first printed circuit board 201 and the frame 202 through an inner wall of the opening 202a.

When a sealing resin 205 made of a liquid thermosetting resin is discharged from a nozzle N into the flow path 204 on the upper surface of the frame 202, the liquid sealing resin 205 passes through a flow path 204 by an operation of surface tension and flows from the upper surface of the frame 202 into a portion between the frame 202 and the second printed circuit board 203 and a portion between the first printed circuit board 201 and the frame 202, and the portion between the frame 202 and the second printed circuit board 203 and the portion between the first printed circuit board 201 and the frame 202 are filled with the liquid sealing resin 205. In this state, when the sealing resin 205 is ultraviolet-cured or thermally cured, the frame 202 and the second printed circuit board 203 are sealed with the cured sealing resin 205, and the first printed circuit board 201 and the frame 202 are sealed with the cured sealing resin 205.

In this manner, the flow path 204 for a sealing resin is formed from the upper surface of the frame 202 to the portion between the frame 202 and the second printed circuit board 203 and the portion between the first printed circuit board 201 and the frame 202, and the sealing resin 205 is caused to flow through the flow path 204 from the upper surface of the frame 202 to the portion between the frame 202 and the second printed circuit board 203 and the portion between the first printed circuit board 201 and the frame 202 to perform sealing. For this reason, filling of the sealing resin 205 can be easily performed, and the printed circuit board 210 having good productivity can be provided.

Figure 14A:
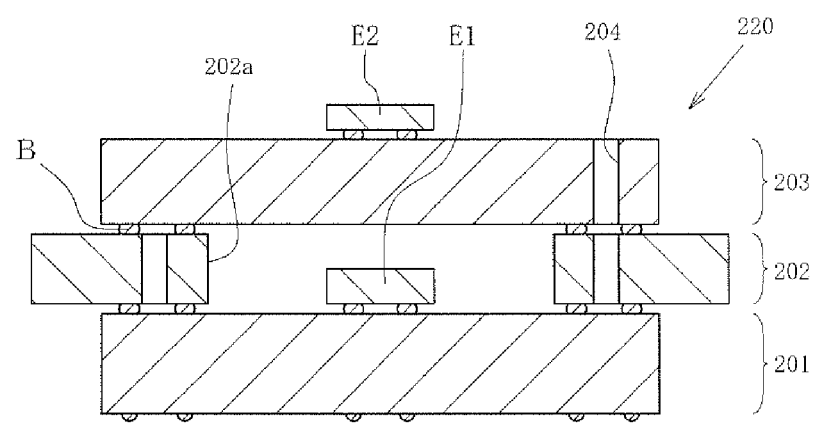
FIG. 14 is a schematic sectional view showing another example of still another embodiment of the present invention.
Figure 14B:
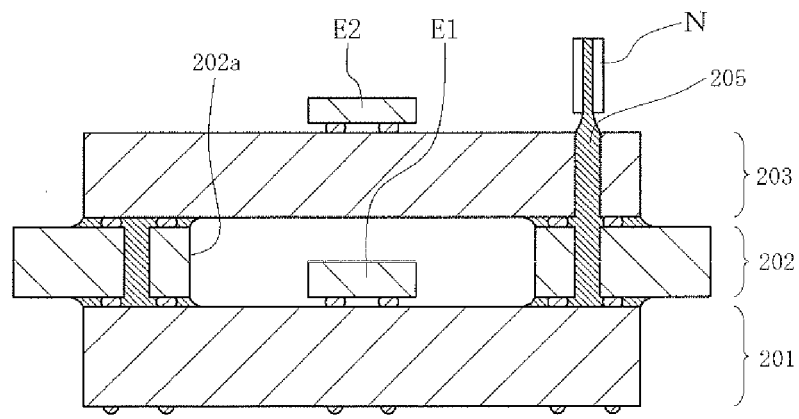

The present invention is not limited to an example of the embodiment of the present invention. For example, as shown in FIGS. 14A and 14B, the flow path 204 for a sealing resin configured by a through hole may be formed from the upper surface of the second printed circuit board 203 to the portion between the frame 202 and the second printed circuit board 203 and the portion between the first printed circuit board 201 and the frame 202. In this case also, the sealing resin 205 is caused to flow through the flow path 204 from the upper surface of the second printed circuit board 203 to the portion between the frame 202 and the second printed circuit board 203 and the portion between the first printed circuit board 201 and the frame 202 to perform sealing. For this reason, filling of the sealing resin 205 can be easily performed, and a printed circuit board 220 having good productivity can be provided. The diameter of the through hole for forming the flow path 204 preferably falls within the range of 200 to 1500 μm.

Furthermore, in the embodiment described above, the flow path 204 is formed by a trench or a through hole. However, the flow path 204 may be formed by a combination of a trench and a through hole. Furthermore, in place of the trench, a flow path 204 formed by a convex stripe may be formed. Furthermore, a flow path guided from the portion between the first printed circuit board 201 and the frame 202 to the portion between the first printed circuit board 201 and the electronic part E1 may be formed on an upper surface of the first printed circuit board 201. In this case, the first printed circuit board 201 and the electronic part E1 can be simultaneously sealed.

The embodiments of the present invention have been described above. However, the present invention is not limited to the embodiments, and various changes and improvements can be made without departing from the spirit and scope of the invention.

What is claimed is:

1. A collective printed circuit board comprising:
   a plurality of printed circuit boards, each having a mounting portion, on which a semiconductor element is mounted, at an upper-surface central portion, having a frame connection pad in an upper-surface outer peripheral portion, and having a solder resist layer containing a resin having an opening exposing the frame connection pad on the surface of the printed circuit boards; and
   a frame having a plurality of through holes having sizes to surround the mounting portions, having a connection conductor around the through holes, and having a solder resist layer containing a resin having an opening exposing the connection conductor on the surface of the frame, wherein
   upper-surface peripheral edge portions of the printed circuit boards and a through-hole peripheral portion of the frame are bonded to each other such that the mounting portions are exposed from the through holes,
   the frame connection pad and the connection conductor are bonded to each other by a conductive bonding material, and
   at least a portion between the solder resist layer on the side of the frame and the solder resist layer on the side of the printed circuit boards is bonded by a sealing resin.

2. The collective printed circuit board according to claim 1, wherein the semiconductor element is mounted on the mounting portion of the printed circuit board.

3. The collective printed circuit board according to claim 1, wherein the sealing resin is filled in a gap between the printed circuit board and the semiconductor element mounted on the printed circuit board.

4. The collective printed circuit board according to claim 1, wherein
   an electronic part having a height enough to project from an upper surface of the frame is mounted on an upper surface of the printed circuit board in the through hole, and
   a second printed circuit board having an opening or a recessed portion adapted to house a portion projecting from the frame of the electronic part at a position corresponding to the electronic part is bonded to the upper surface of the frame.

5. The collective printed circuit board according to claim 1, wherein
   at least one of a plurality of through holes and trenches is formed at a position corresponding to a bonding portion between the frame and the printed circuit board, and
   a second printed circuit board having a second through hole at positions corresponding to the through holes and the trenches is bonded to the upper surface of the frame without completely closing the through hole.

6. The collective printed circuit board according to claim 1, wherein a surface opposing the bonding portion between the frame and the printed circuit board has an external connection pad to which an external electric circuit board is connected.

7. The collective printed circuit board according to claim 1, further comprising a second printed circuit board bonded to an upper surface of the frame to close the opening of the frame, wherein
   a third printed circuit board having a layer configuration or a material different from that of the frame is bonded between the printed circuit board and the second printed circuit board inside the opening.

8. The collective printed circuit board according to claim 7, wherein the frame is a buildup multi-layered board, and the third printed circuit board is a through hole board.

9. The collective printed circuit board according to claim 7, wherein
   a heat conductivity of the third printed circuit board is higher than a heat conductivity of the frame.

10. The collective printed circuit board according to claim 1, further comprising a second printed circuit board bonded to an upper surface of the frame through a solder bump to cover the opening of the frame, wherein
   a flow path for the sealing resin is formed from the upper surface of the frame or an upper surface of the second printed circuit board to a portion between the frame and the second printed circuit board and a portion between the printed circuit board and the frame, and
   the sealing resin flows through the flow path from the upper surface of the frame or the upper surface of the second printed circuit board to the portion between the frame and the second printed circuit board and the portion between the printed circuit board and the frame to perform filling of the sealing resin.

11. The collective printed circuit board according to claim 10, wherein the flow path is formed by at least one of a trench, a through hole, and a convex stripe.

* * * * *